(12) United States Patent
Park et al.

(10) Patent No.: US 10,170,683 B2
(45) Date of Patent: Jan. 1, 2019

(54) PIEZOELECTRIC VIBRATION MODULE

(71) Applicant: MPLUS CO., LTD., Suwonsi, Gyeonggi-do (KR)

(72) Inventors: Jung Hyun Park, Suwon-si (KR); Yeon Ho Son, Suwon-si (KR)

(73) Assignee: MPLUS CO., LTD., Suwon-si, Gyeonggi-Do (KR)

( * ) Notice: Subject to any disclaimer, the term of this patent is extended or adjusted under 35 U.S.C. 154(b) by 253 days.

(21) Appl. No.: 15/185,444

(22) Filed: Jun. 17, 2016

(65) Prior Publication Data

US 2017/0025595 A1    Jan. 26, 2017

(30) Foreign Application Priority Data

Jul. 21, 2015    (KR) .................. 10-2015-0102998

(51) Int. Cl.
| | |
|---|---|
| H01L 41/04 | (2006.01) |
| H01L 41/047 | (2006.01) |
| H01L 41/053 | (2006.01) |
| H01L 41/083 | (2006.01) |
| H01L 41/09 | (2006.01) |

(52) U.S. Cl.
CPC ........ H01L 41/0475 (2013.01); H01L 41/053 (2013.01); H01L 41/083 (2013.01); H01L 41/0986 (2013.01)

(58) Field of Classification Search
CPC . H01L 41/0475; H01L 41/053; H01L 41/083; H01L 41/0986

USPC .......................................... 310/328
See application file for complete search history.

(56) References Cited

U.S. PATENT DOCUMENTS

| | | | |
|---|---|---|---|
| 2012/0212100 A1 | 8/2012 | Lee | |
| 2014/0055932 A1* | 2/2014 | Nakamura | H01L 41/0986 361/679.01 |
| 2014/0159546 A1* | 6/2014 | Kim | H01L 41/0471 310/328 |

FOREIGN PATENT DOCUMENTS

| | | |
|---|---|---|
| CN | 104078559 A | 10/2014 |
| CN | 104350624 A | 2/2015 |

OTHER PUBLICATIONS

SIPO Office Action for Chinese Patent Application No. 201610581281.3 which corresponds to the above-identified U.S. application.

* cited by examiner

*Primary Examiner* — Derek Rosenau
(74) *Attorney, Agent, or Firm* — LRK Patent Law Firm

(57) ABSTRACT

A piezoelectric vibration module includes external electrodes arranged in a stack direction on the outside surface of a piezoelectric device so that the state in which the piezoelectric device is coupled to the terminals of an FPCB can be reliably maintained even in a piezoelectric device bending phenomenon dependent on the repetition of contraction and/or expansion of the piezoelectric device. A portion in which the external electrodes of the piezoelectric device come in contact with the FPCB may be placed in a portion having small displacement.

15 Claims, 12 Drawing Sheets

PIEZOELECTRIC VIBRATION MODULE

CROSS REFERENCE TO RELATED APPLICATION

The present application claims the benefit of Korean Patent Application No. 10-2015-0102998 filed in the Korean Intellectual Property Office on Jul. 21, 2015, the entire contents of which are incorporated herein by reference.

BACKGROUND OF THE INVENTION

1. Technical Field

The present invention relates to a piezoelectric vibration module.

2. Description of the Related Art

In general, in portable electronic devices, such as a handheld phone, an E-book terminal, a gaming machine, and a PMP, a vibration function is used for various purposes.

In particular, a vibration generation device for generating such a vibration is chiefly mounted on a portable electronic device and used as an alarm function, that is, a silent incoming signal.

In line with the multi-functionality of such a portable electronic device, there is a need for a vibration generation device having a small size, a high degree of integration, and various high functions.

Furthermore, recently, a touch type device for performing input by touching a portable electronic device is commonly adopted according to the demand of users who try to conveniently use portable electronic devices.

A current haptic device includes even a concept on which the intuitive experiences of an interface user are incorporated and feedback to a touch is further diversified in addition to a concept in which input is performed by a touch.

In general, such a haptic device repeatedly expands and/or contracts in response to external power applied to piezoelectric device, thus providing vibration. A vibration generator adopting a piezoelectric device is disclosed in Patent Document 1.

A piezoelectric vibration device disclosed in Patent Document 1 vibrates while generating maximum displacement in both ends up and down using a central portion as a vibration action point or generates vibration by generating maximum displacement in the central portion up and down using both ends as vibration action points in response to a change in the polarity of a voltage applied thereto.

Such a piezoelectric vibration device for generating vibration includes a substrate, a piezoelectric element layer having a piezoelectric material stacked on one surface or both surfaces of the substrate, and an electrode layer for applying a voltage to the top and bottom surfaces of the piezoelectric element layer. As widely known to those skilled in the art, when a signal from the substrate is applied to the piezoelectric element layer, the piezoelectric element layer performs a repetitive vibration movement, and thus it is frequently separated from the piezoelectric vibration device soldered to the end of the substrate.

PRIOR ART DOCUMENT

Patent Document (Patent Document 1) U.S. Patent Application Publication No. 2012/0212100

SUMMARY OF THE INVENTION

An embodiment of the present invention provides a piezoelectric vibration module, which is capable of preventing a crack by minimizing the concentration of stress between the external electrodes of a piezoelectric device and the contact portions of an FPCB in such a way as to restrict the external electrodes and the contact portions to a portion having narrow displacement and thus improving the extraction force of the external electrode and the FPCB.

Furthermore, an embodiment of the present invention can provide an advantage of reducing a thickness by coating conductive adhesives on corner portions in which the piezoelectric device and the terminals of the FPCB are intersected without interposing the conductive adhesives between the external electrodes of the piezoelectric device and the terminals of the FPCB in a stack state.

A piezoelectric vibration module according to an embodiment of the present invention includes a vibration plate configured to generate a vibration force through up and down translational motions, a cover, a mass body, and a bracket.

The vibration plate may generate the up and down translational motions of the vibration plate by adopting a piezoelectric device subjected to contraction and/or expansion deformation in response to power applied thereto.

In this case, the piezoelectric device having a rectangular parallelepiped shape is supplied with external power using a printed circuit hoard or a flexible printed circuit board (FPCB) as means. More specifically, external electrodes formed on the outside surface of the piezoelectric device and the terminals of the FPCB are disposed to come in contact with each other. The external electrodes are coated (or included) on the outside surface of the piezoelectric device so that the state in which the piezoelectric device is coupled to the terminals of the FPCB can be reliably maintained even in a piezoelectric device bending phenomenon dependent on the repetition of contraction and/or expansion of the piezoelectric device.

In a first embodiment of the present invention, the external electrodes are disposed at the ends of a pair of wide-width sides of the piezoelectric device which face each other. That is, a first external electrode may be disposed on one side of the wide-width sides, whereas a second external electrode may be disposed on the other side of the wide-width sides.

In a second embodiment of the present invention, the external electrodes are disposed at the end of a predetermined one of the pair of wide-width sides of the piezoelectric device. That is, a first external electrode may be adjacent to the end of one wide-width side, whereas a second external electrode may be spaced apart from the first external electrode on the same wide-width side.

In a third embodiment of the present invention, the external electrodes are disposed on a pair of narrow-width sides of the piezoelectric device which face each other. That is, a first external electrode may be disposed on one narrow-width side, whereas a second external electrode may be spaced apart from the first external electrode on the same narrow-width side.

Characteristics and advantages according to embodiments of the present invention will become more evident from the following detailed description based on the accompanying drawings.

Terms or words used hereinafter should not be construed as having common or dictionary meanings, but should be construed as having meanings and concepts that comply with the technical spirit of the present invention based on the principle that the inventor may appropriately define the terms or words as concepts for describing them in such a way as to best describe his or her invention.

DETAILED DESCRIPTION

Figure 1:
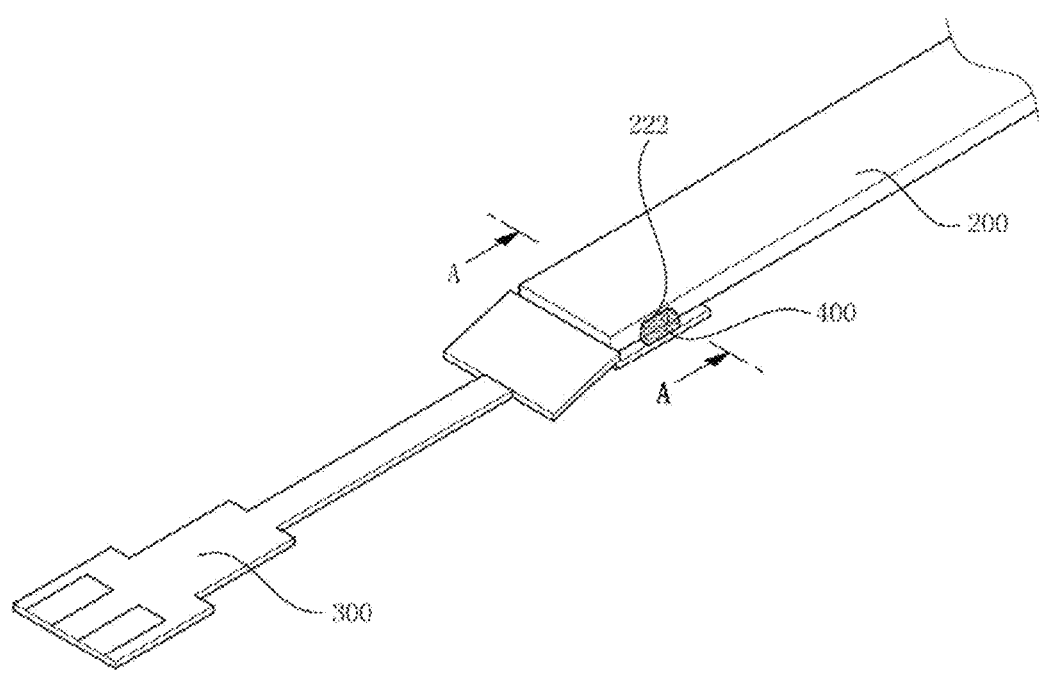
FIG. 1 is a perspective view schematically showing a piezoelectric device according to a first embodiment of the present invention.

The merits and characteristics of the present invention and methods for achieving the merits and characteristics thereof will become more apparent from the following embodiments taken in conjunction with accompanying drawings. In this specification, in assigning reference numerals to the elements of the drawings, the same or similar elements are assigned the same reference numerals throughout the specification. Furthermore, in this specification, a detailed description of a related known technology will be omitted if it is deemed to make the gist of the present invention unnecessarily vague.

A piezoelectric vibration module according to an embodiment of the present invention is described in detail with reference to the accompanying drawings.

A piezoelectric device 200 according to a first embodiment of the present invention is described in detail with reference to FIGS. 1 to 3.

Figure 2:
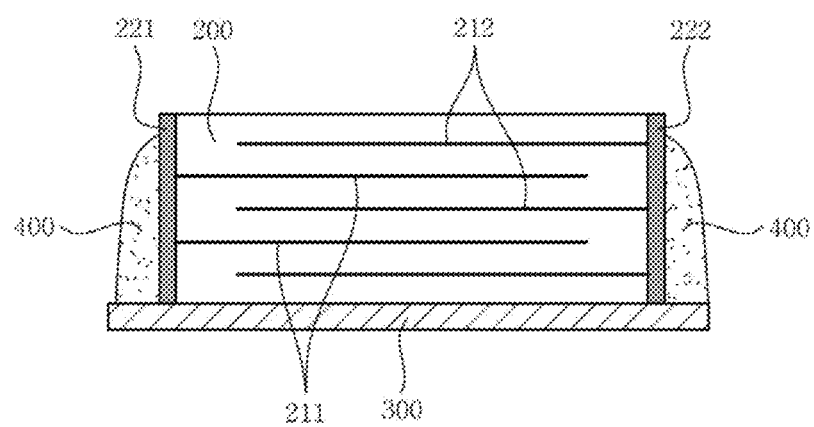
FIG. 2 is a cross-sectional view taken alone line A-A of FIG. 1.
Figure 3:
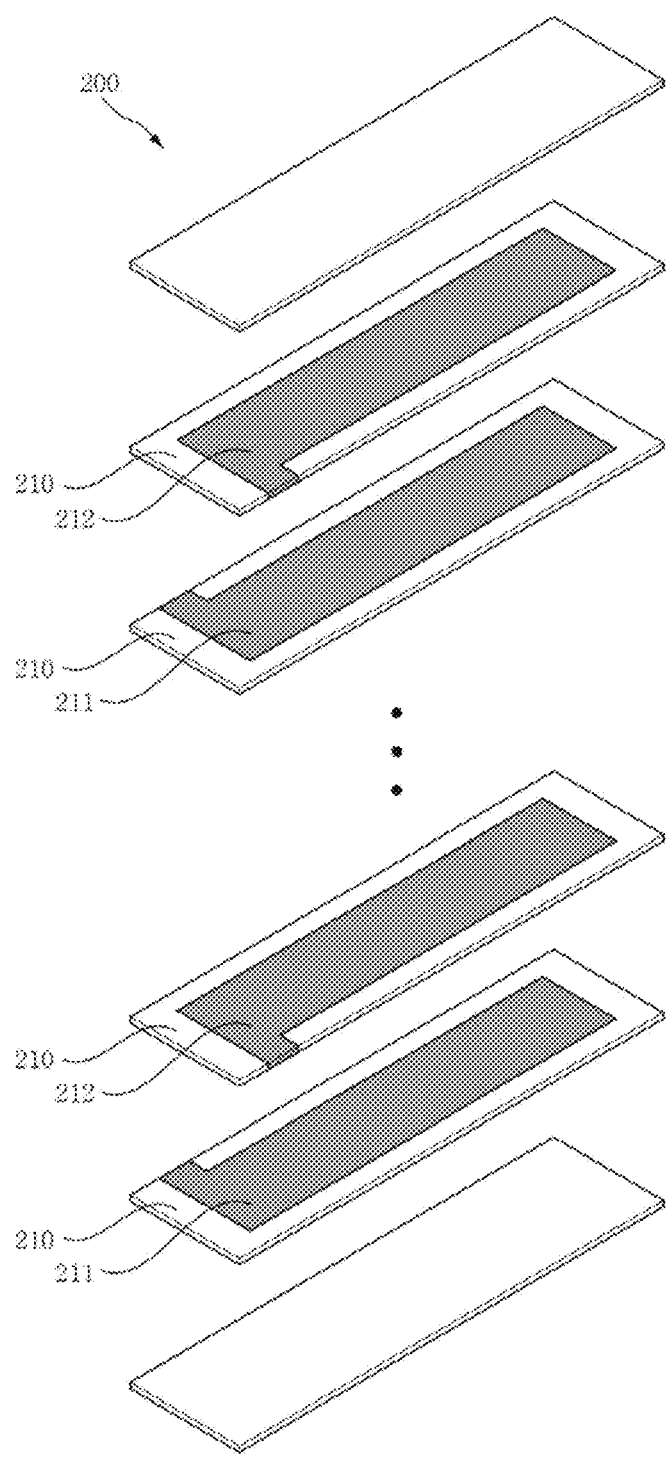
FIG. 3 is an exploded perspective view schematically showing the piezoelectric device of FIG. 1.

FIGS. 1 to 3 show the state in which the piezoelectric device 200 according to the first embodiment of the present invention and a flexible printed circuit board (FPCB) 300 are schematically coupled.

The piezoelectric device 200 according to the first embodiment of the present invention may generate driving by repeatedly performing contraction and/or expansion deformation on the piezoelectric device 200 configured to convert electric energy into mechanical vibration in response to power applied by a printed circuit board, preferably, then FPCB 300. The piezoelectric device 200 according to an embodiment of the present invention may be used as means for transferring a vibration force, generated by the repetition of the contraction and/or expansion deformation, to a touch screen panel, for example.

A piezoelectric vibration module 1 (refer to FIG. 11) electrically communicates with the first and second external electrodes 221 and 222 of the piezoelectric device 200 and the terminal of the FPCB 300 using conductive adhesives 400, for example, as means.

As shown, the piezoelectric device 200 is formed by stacking a plurality of thin forming sheets 210. In this case, the patterns of a first internal electrode 211 and a second internal electrode 212 designed on the respective forming sheet 210 in a required form are alternately printed. The forming sheets 210 on which the internal electrodes 211 and 212 have been printed are stacked in a multi-layer form and integrated into a single small body. The first and the second external electrodes 221 and 222 are disposed on the outside surface of the piezoelectric device 200. The first and the second external electrodes 221 and 222 are fixed to the respective terminals of the FPCB 300, for example, through fixing means, for example, the conductive adhesives 400 so that they are electrically connected to the terminals. For reference, one end of the FPCB 300 is adjacent to the piezoelectric device 200 so that it is coupled to the first and the second external electrodes 221 and 222 of the piezoelectric device 200 as described above, whereas the other end of the FPCB 300 is drawn to the outside of the piezoelectric vibration module for accommodating the piezoelectric device 200.

The piezoelectric device 200 stacked in a multi-layer form as described above can secure an electric field necessary to drive the piezoelectric device even in a low external voltage. Accordingly, there is an advantage in that a voltage for driving the piezoelectric vibration module according to an embodiment of the present invention can be reduced.

Furthermore, the piezoelectric device 200 may have a multi-layer form having a specific thickness so that it complies with an oscillating frequency required by a user while lowering the height of the piezoelectric vibration module.

As shown, in an embodiment of the present invention, the piezoelectric device 200 has a thin and rectangular parallelepiped form. The plurality of internal electrodes 211 and 212 having different heights are disposed in the piezoelectric device 200. The first and the second external electrodes 221 and 222 are formed on the outside surface of the piezoelectric device 200. In this case, the first external electrode 221 is electrically connected to the first internal electrodes 211, and the second external electrode 222 is electrically connected to the second internal electrodes 212.

In particular, the first and the second external electrodes 221 and 222 are disposed on the outside surface of the piezoelectric device 200 in such way as to be separated from each other and are formed by coating or depositing a conductive paste made of silver (Ag) using an electrode thin film forming process, for example, a dipping method, a silk printing method, or a sputtering method.

In the driving process of the first and the second external electrodes 221 and 222 coated on the outside surface of the piezoelectric device 200 according to an embodiment of the present invention through millions of contraction and/or expansion deformation, the first and the second external electrodes 221 and 222 are frequently peeled off from the piezoelectric device 200 when an unexpected drop and impact is generated or due to a difference in the coefficient of thermal expansion between the piezoelectric device 200 and the first and the second external electrodes 221 and 222.

Figure 12:
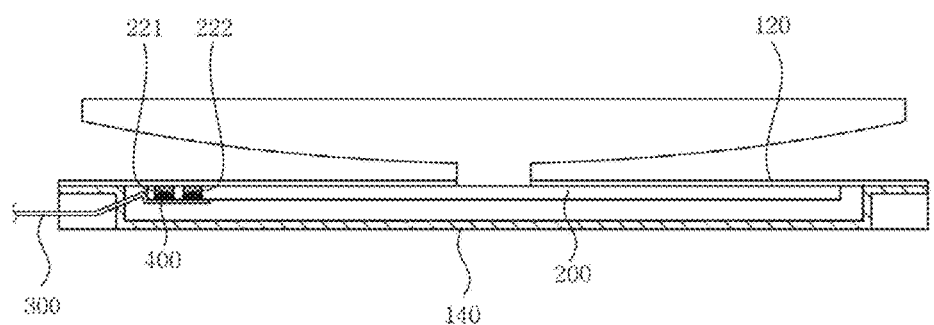
FIG. 12 is a side view of the piezoelectric vibration module other than a cover, which is viewed from the side.

As shown FIG. 12, the piezoelectric device 200 is attached to the bottom surface of a vibration plate 120 in a stack state and generates moment in the central portion of the vibration plate 120 through contraction and/or expansion deformation in response to power applied thereto. The central portion of the vibration plate 120 moves up and down in an arch form because the moment is generated in the state in which the vibration plate 120 has been fixed to the spacers 141 of a bracket 140. When the piezoelectric device 200 moves up and down in an arch form as described above, the amount of deformation stress is increased as it becomes farther from the central portion of the piezoelectric device 200. In other words, the piezoelectric device 200 has a structure in which stress is concentrated on the end of the top surface or bottom surface of the piezoelectric device 200 because the degree of contraction and/or expansion deformation is increased at the end.

If the terminals of the FPCB 300 is fixed to the top surface or bottom surface of the piezoelectric device 200, the piezoelectric device 200 may be broken at the end of the top surface or bottom surface, that is, a stress concentration portion, resulting in an electrical short-circuit phenomenon.

Accordingly, in the piezoelectric device 200 according to an embodiment of the present invention, the first and the second external electrodes 221 and 222 are provided on the sides or the outside surface of the piezoelectric device 200, that is, in the stack direction of the piezoelectric device. Since the first and the second external electrodes 221 and 222 are coated on the sides in the stack direction of the piezoelectric device, there is an advantage in that the thickness of the piezoelectric vibration module can be reduced although the FPCB is not mounted on the top surface (or the bottom surface) of the piezoelectric device as in the prior art.

More specifically, the first external electrode 221 is coated on one of the wide-width sides of the piezoelectric device 200, and the second external electrode 222 is coated on the other of the wide-sides of the piezoelectric device 200. The first external electrode 221 and the second external electrode 222 are disposed on the respective wide-width sides extended in the length direction of the piezoelectric device 200. The term "the other wide-width side" means another wide-width side disposed to be opposite one wide-width side. Alternatively, the first and the second external electrodes 221 and 222 are spaced apart from each other at an interval between the pair of wide-width sides in one end of the piezoelectric device 200, thus providing a structure in which the first external electrode 221 cannot communicate with the second external electrode 222. For example, the first and the second external electrodes 221 and 222 are adjacent to one end of the piezoelectric device 200. The end of the piezoelectric device 200 is a portion in which up and down amplitude displacement is the smallest, being capable of minimizing a short-circuit with the FPCB.

Figure 4:
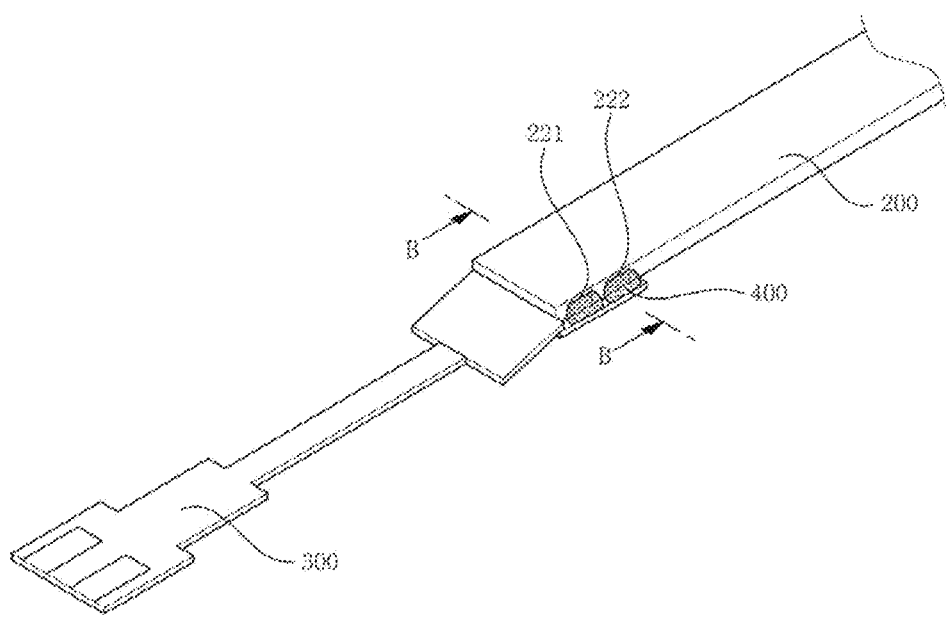
FIG. 4 is a perspective view schematically showing a piezoelectric device according to a second embodiment of the present invention.
Figure 5:
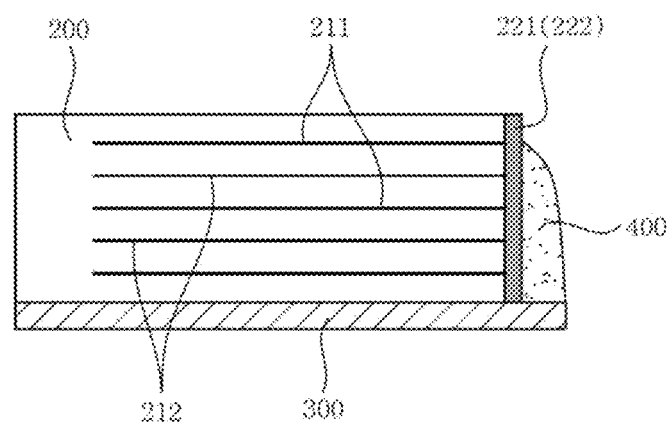
FIG. 5 is a cross-sectional view taken along line B-B of FIG. 4.
Figure 6:
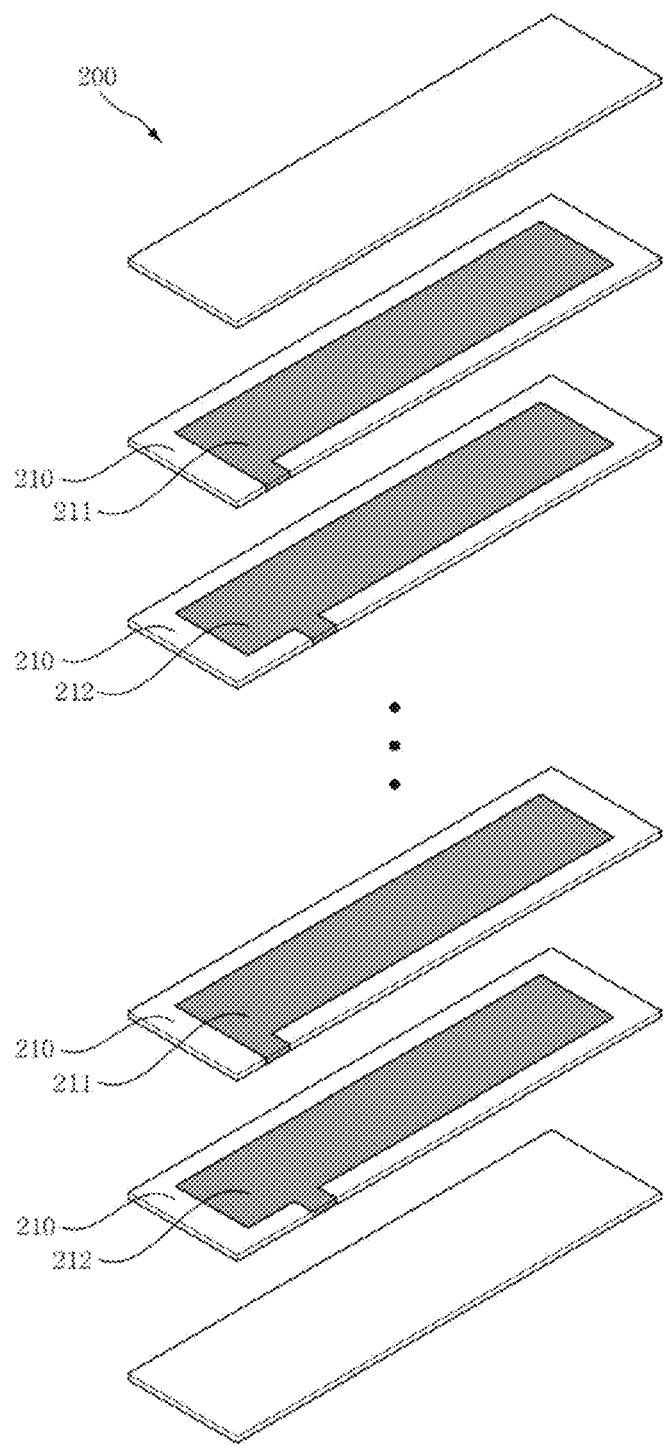
FIG. 6 is an exploded perspective view schematically showing the piezoelectric device of FIG. 4.

FIGS. 4 to 6 schematically show the piezoelectric device 200 according to a second embodiment of the present invention.

The piezoelectric device 200 according to the second embodiment of the present invention has a structure similar to that of the piezoelectric device 200 of FIGS. 1 to 3 except the external electrodes of the piezoelectric device 200. Accordingly, in order to help clear understanding of the present invention, a description of the similar or same elements is omitted.

As shown FIG. 12, in the piezoelectric device 200 according to the second embodiment of the present invention, the piezoelectric device 200 and the vibration plate 120 are spaced apart from the bracket 140 at a specific interval. Both ends of the vibration plate 120 is fixed to the spacers 141 of the bracket 140. The piezoelectric device 200 is bent and deformed up and down through contraction and/or expansion. As described above, the amount of deformation stress at the ends of the top surface and bottom surface of the piezoelectric device 200 is increased in the length direction of the piezoelectric device 200.

Based on such a principle, in the piezoelectric device 200 according to the second embodiment of the present invention, the first and the second external electrodes 221 and 222 are formed on one of the wide sides extended in the length direction of the piezoelectric device 200. In particular, in the second embodiment of the present invention, the first and the second external electrodes 221 and 222 are disposed on the same wide-width side formed in the stack direction of the piezoelectric device in such a way as to be separated from each other.

In addition, the first and the second external electrodes 221 and 222 are adjacent to an end of the thin and long piezoelectric device 200.

Figure 7:
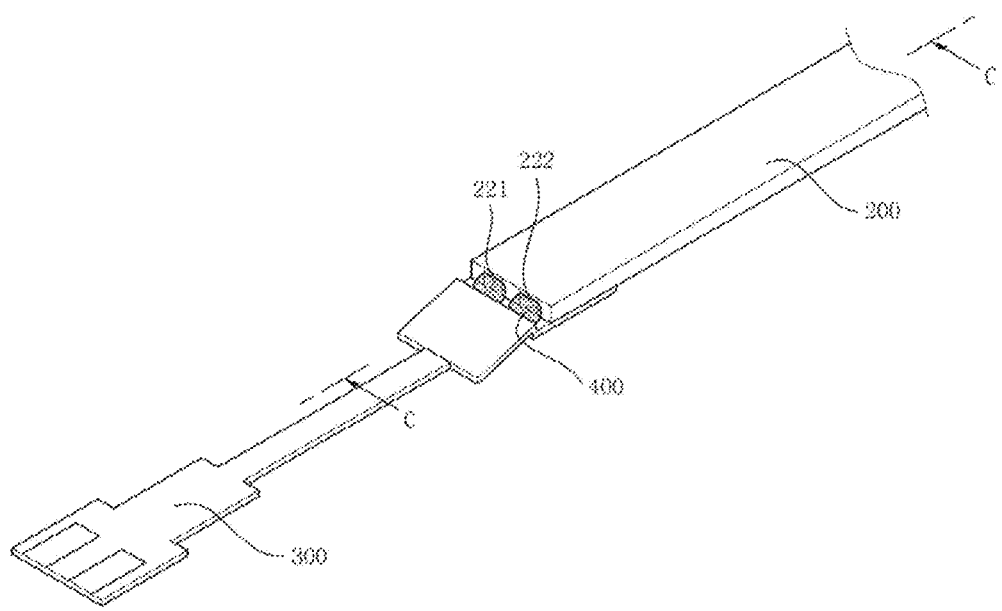
FIG. 7 is a perspective view schematically showing a piezoelectric device according to a third embodiment of the present invention.
Figure 8:
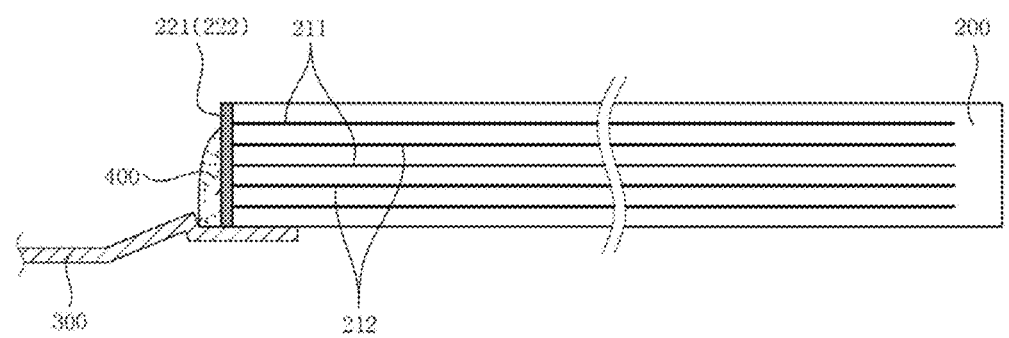
FIG. 8 is a cross-sectional view taken along line C-C of FIG. 6.
Figure 9:
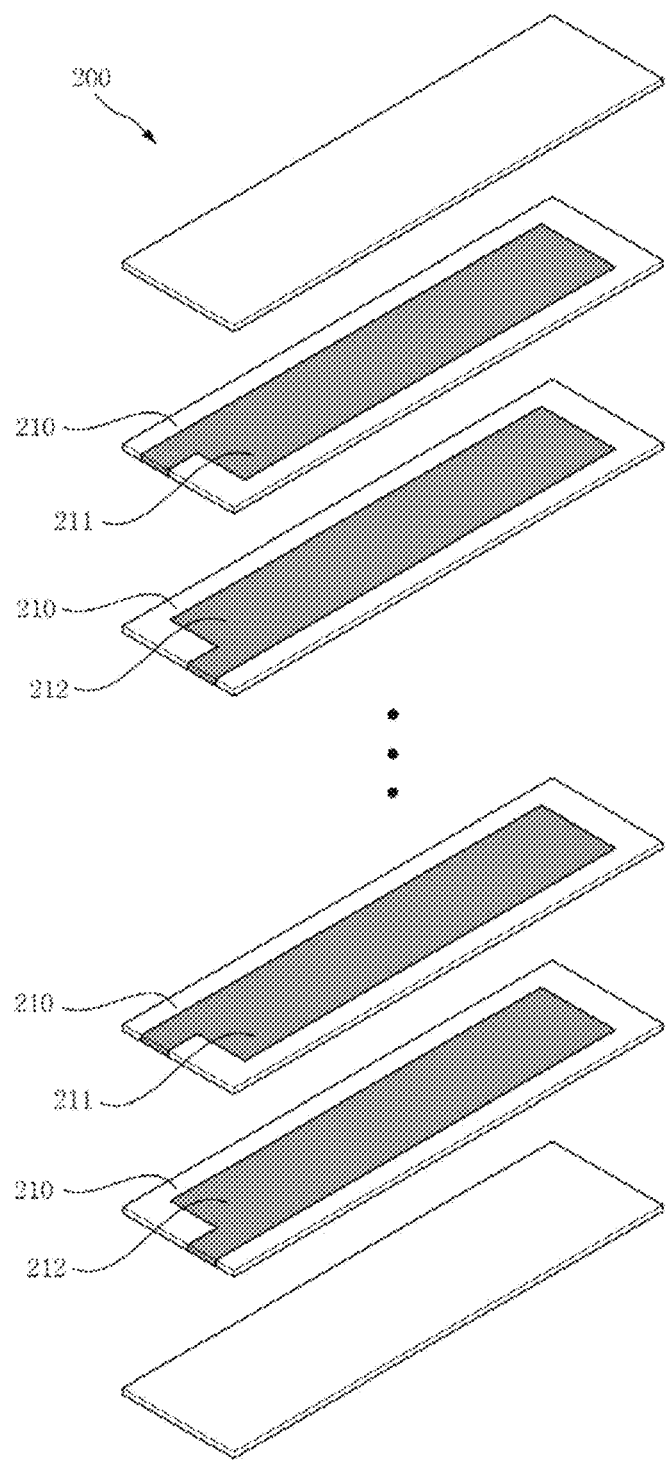
FIG. 9 is an exploded perspective view schematically showing the piezoelectric device of FIG. 7.

FIGS. 7 to 9 schematically show the piezoelectric device 200 according to a third embodiment of the present invention.

In the piezoelectric device 200 according to the third embodiment of the present invention, the first and the second external electrodes 221 and 222 are formed on one of narrow-width sides extended to be orthogonal to the length direction of the piezoelectric device. In this case, the first and the second external electrodes 221 and 222 are formed on a narrow-width side adjacent to the terminals of the FPCB 300. In the third embodiment of the present invention, first and the second external electrodes 221 and 222 are disposed on the same narrow-width side formed in the stack direction of the piezoelectric device in such a way as to be separated from each other.

As shown, the terminals of the FPCB 300 is bent in such a way as to overlap the narrow-width side of the piezoelectric device including the first and the second external electrodes 221 and 222, thereby being capable of maintaining a reliable contact state.

In other words, the length direction of the piezoelectric device 200 according to the third embodiment of the present invention is placed on the same line as the length direction of the FPCB 300. Since the chance of the terminals of the FPCB 300 coming in contact with the top surface or bottom surface of the piezoelectric device 200 is minimized, there is no influence on the bending deformation of the piezoelectric device 200 and a reliable coupling state between the FPCB and the piezoelectric device can be guaranteed.

Figure 10:
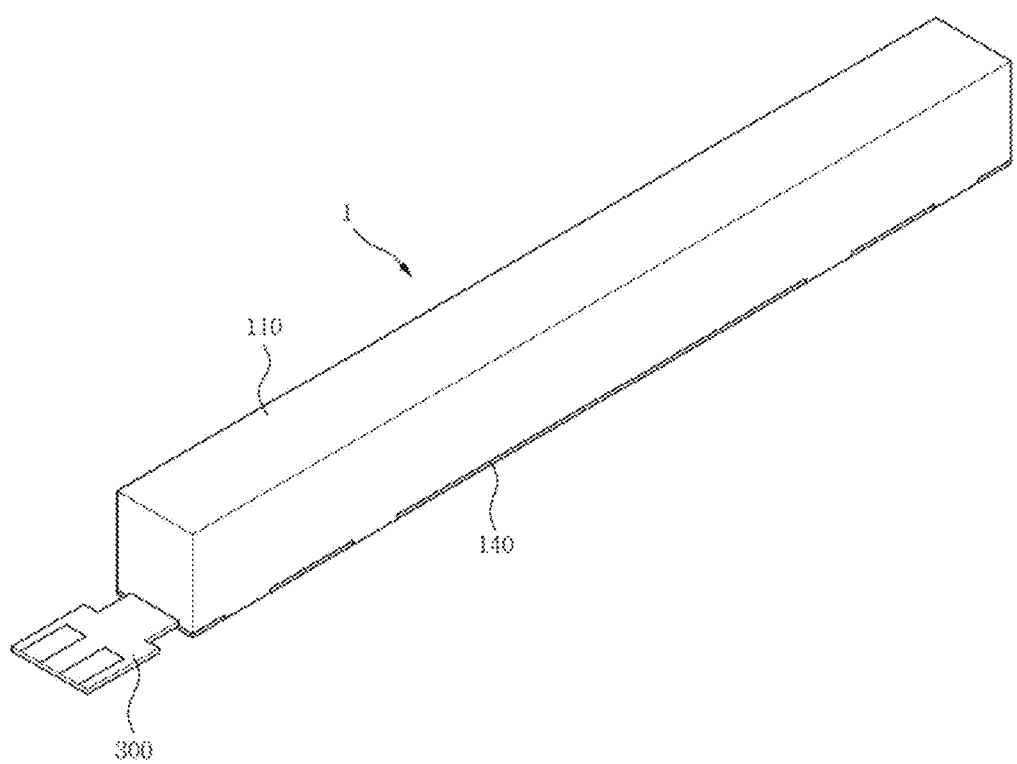
FIG. 10 is a perspective view a piezoelectric vibration module adopting the piezoelectric device.
Figure 11:
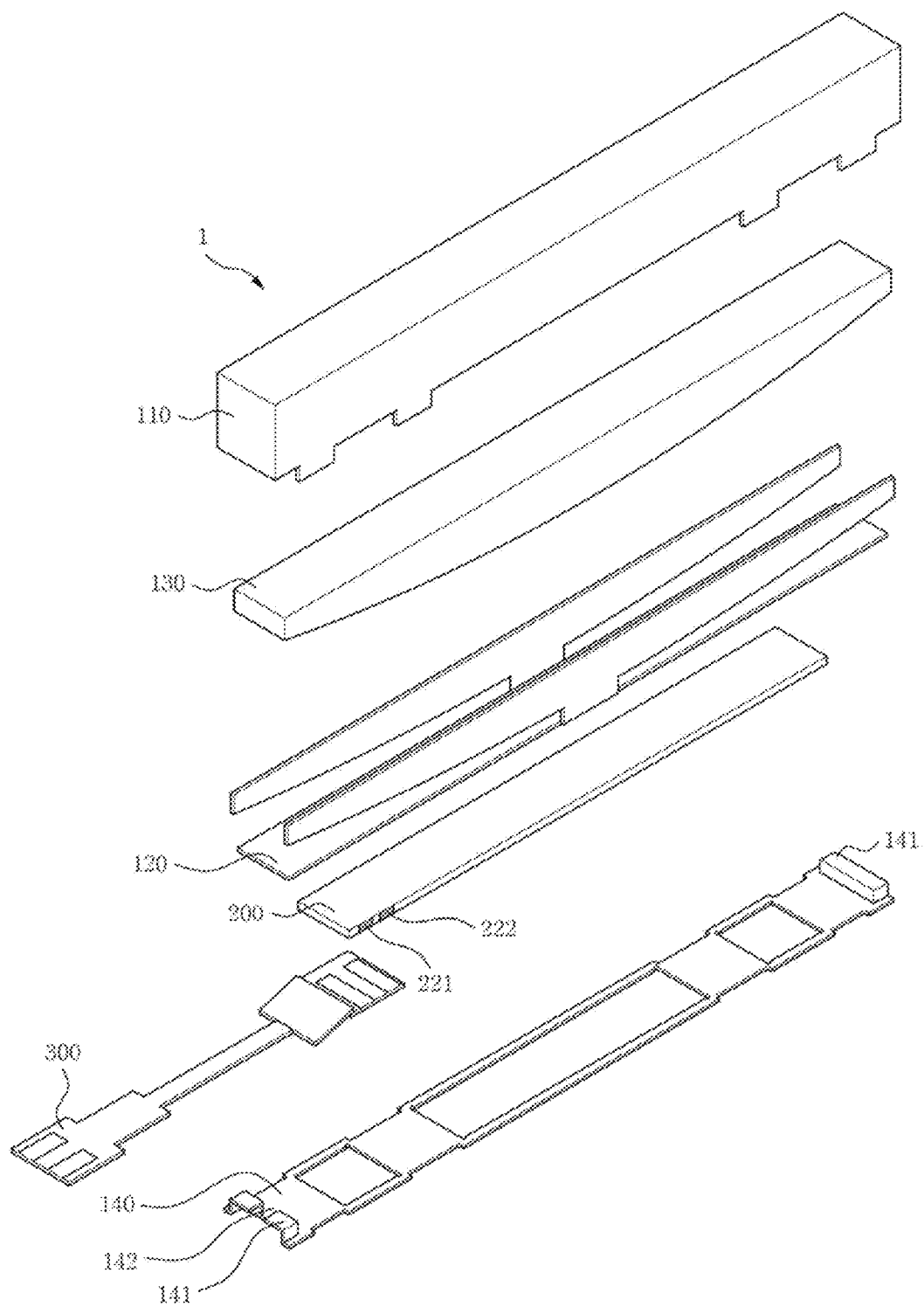
FIG. 11 is an exploded perspective view schematically showing the piezoelectric vibration module of FIG. 10.

The piezoelectric vibration module 1 according to an embodiment of the present invention is shown in FIGS. 10 to 12, and it includes a cover 110, the vibration plate 120, a mass body 130, and the bracket 140. For reference, the piezoelectric vibration module 1 shown in FIGS. 10 to 12 has been illustrated as adopting the piezoelectric device according to the second embodiment of the present invention, but is not limited thereto. For example, the piezoelectric vibration module 1 may adopt the piezoelectric device according to the first embodiment or the piezoelectric device according to the third embodiment.

The cover 110 has a box shape whose one side is open and receives the vibration plate 120 on which a driving body, that is, the piezoelectric device 200, has been mounted in its internal space.

The vibration plate 120 functions to the vibration force of the piezoelectric device 200 to an external part through a bending action according to the repetition of expansion and contraction deformation in conjunction with the piezoelectric device 200. The vibration plate 120 has a flat plate shape. The piezoelectric device 200 mounted on the flat one surface (specifically, the bottom surface) of the vibration plate 120, and the mass body 130 is disposed on the other surface (specifically, the top surface) of the vibration plate 120, but is not limited thereto. For example, the mass body 130 may be disposed on the bottom surface of the vibration plate 120, and the piezoelectric device 200 may be placed on the top surface of the vibration plate 120. The vibration plate 120 includes the FPCB 300 for applying power to drive the piezoelectric device 200.

In particular, the vibration plate 120 is made of metal having elasticity, for example, SUS so that it is integrated and deformed with the piezoelectric device 200 repeatedly subjected to expansion or contraction deformation in response to external power applied by the FPCB 300. Furthermore, if the vibration plate 120 and the piezoelectric device 200 are coupled using a bonding coupling method, the vibration plate 120 may be made of invar, that is, a material having a coefficient of thermal expansion similar to that of the piezoelectric device 200, in order to prevent a bending phenomenon generated due to the hardening of a bonding member.

As described above, the vibration plate 120 is made of invar having a coefficient of thermal expansion similar to that of the piezoelectric device 200. Accordingly, there is an advantage of preventing a piezoelectric deterioration phenomenon in which the electrical characteristics of the piezoelectric device 200 are deteriorated because thermal stress generated when the piezoelectric device 200 operates in an external high-temperature environment or when it is subjected to a thermal impact is reduced.

The mass body 130 may be made of metal, for example, tungsten having relatively high density in the same volume.

As shown, the bracket 140 is formed of a plate that is generally thin, long, and flat. The bracket 140 has a size and shape capable of closing the open bottom surface of the cover 110. As described above, when power is applied to the piezoelectric device 200, the central portion of the vibration plate 120 is deformed up and down. Upon driving, the vibration plate 120 is driven up and down. At this time, in order to prevent the vibration plate 120 from coming in contact with the cover 110 and the bracket 140, the vibration plate 120 needs to be spaced apart from the cover 110 and the bracket 140 at a specific interval.

In an embodiment of the present invention, the spacers 141 that are vertically and upward are formed at both ends of the bracket 140. The two spacers 141 support both ends of the vibration plate 120 and generally separate the vibration plate 120 and the bracket 140, thereby being capable of providing a space.

In addition, the spacers 141 include a guide groove 142, thus providing a path through which the FPCB 300 may penetrate. In this case, the FPCB 300 may extend to the outside through part of the piezoelectric vibration module 1 without coming in contact with another element.

The cover 110 and the bracket 140 may be coupled using various methods, such as caulking, welding, or bonding which are widely known to those skilled in the art.

Although the detailed embodiments of the present invention have been described above, they have been provided to describe the present invention in detail. The piezoelectric vibration module according to an embodiment of the present invention is not limited to the embodiments and may be evidently changed and modified by those skilled in the art without departing from the technical spirit of the present invention.

All of simple modifications and changes of the present invention belong to the scope of the present invention, and a detailed scope of the present invention will become evident from the claims.

What is claimed is:

1. A piezoelectric vibration module comprising:
a piezoelectric device which comprises:
one or more first internal electrodes;
one or more second internal electrodes alternately formed with the first internal electrodes without crossing the one or more first internal electrodes;
a first external electrode electrically connected to the one or more first internal electrodes; and
a second external electrode electrically connected to the one or more second internal electrodes,
wherein the first external electrode and the second external electrode are only disposed on lateral surfaces of the piezoelectric device, and
wherein the first external electrode and the second external electrode are fixed to terminals of a flexible printed circuit board (FPCB) through conductive adhesives so that the first external electrode and the second external electrode are electrically connected to the terminals of the FPCB, the conductive adhesives being coated on lateral surfaces of the first external electrode and the second external electrode at corner portions where the piezoelectric device and the terminals of the FPCB intersect.

2. The piezoelectric vibration module of claim 1, wherein:
the piezoelectric device comprises wide-width sides of the lateral surfaces extended in a length direction of the piezoelectric device and narrow-width sides of the lateral surfaces disposed to be orthogonal to the length direction, and
the piezoelectric device has a thin and long shape.

3. The piezoelectric vibration module of claim 1, wherein the first external electrode and the second external electrode are coated on the lateral surfaces of the piezoelectric device in a stack direction of the piezoelectric device.

4. The piezoelectric vibration module of claim 2, wherein:
the first external electrode is formed on a first one of the wide width sides of the lateral surfaces of the piezoelectric device, and
the second external electrode is formed on a second one of the wide-width sides of the lateral surfaces of the piezoelectric device.

5. The piezoelectric vibration module of claim 1, wherein the first external electrode and the second external electrode are only disposed on one wide-width side of the lateral surfaces of the piezoelectric device and separated from each other.

6. The piezoelectric vibration module of claim 1, wherein the first external electrode and the second external electrode are only coated on a narrow-width side of the lateral surfaces of the piezoelectric device.

7. The piezoelectric vibration module of claim 1, further comprising:
a cover which has one side opened and forms an internal space;
a bracket which is coupled to the open side of the cover on one side thereof to block the internal space of the cover;
a vibration plate which has the piezoelectric device mounted thereon and is disposed within the cover and the bracket to be driven up and down; and
a flexible printed circuit board (FPCB) which has an end portion on a first side, thereof come in contact with the external electrode of the piezoelectric device, and another end portion on a second side thereof drawn to an outside of the piezoelectric vibration module, wherein in response to application of an external power, the piezoelectric device keeps repeating expansion and contraction deformation to generate a vibration force.

8. The piezoelectric vibration module of claim 7, wherein the vibration plate comprises a mass body in order to increase a vibration force of the piezoelectric device.

9. The piezoelectric vibration module of claim 7, wherein the vibration plate and the bracket are spaced apart from each other at a specific interval.

10. The piezoelectric vibration module of claim 7, wherein the FPCB comprises terminals and applies power to the first and the second external electrodes of the piezoelectric device.

11. The piezoelectric vibration module of claim 10, wherein the terminals of the FPCB are arranged in parallel with a stack direction of the piezoelectric device.

12. The piezoelectric vibration module of claim 10, wherein the terminals of the FPCB are bent in such a way as to overlap a narrow width in which the external electrodes are present.

13. The piezoelectric vibration module of claim 10, wherein the first external electrode and the second external electrode are electrically connected to the respective terminals of the FPCB.

14. The piezoelectric vibration module of claim 7, wherein the bracket comprises spacers protruded vertically and upward at both ends thereof.

15. The piezoelectric vibration module of claim 13, wherein the spacers form a guide groove.

* * * * *